(12) United States Patent
Leman

(10) Patent No.: US 6,491,526 B2
(45) Date of Patent: Dec. 10, 2002

(54) RISER CARD ASSEMBLY AND METHOD FOR ITS INSTALLATION

(75) Inventor: Michael V. Leman, Eagel, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/891,623

(22) Filed: Jun. 25, 2001

(65) Prior Publication Data

US 2002/0072255 A1 Jun. 13, 2002

Related U.S. Application Data

(63) Continuation of application No. 09/375,157, filed on Aug. 16, 1999, now Pat. No. 6,261,104.

(51) Int. Cl.[7] .............................................. H01R 12/00
(52) U.S. Cl. ...................................... 439/61; 361/752
(58) Field of Search ......................... 439/61, 752, 64, 439/62, 77, 67; 361/752, 784, 788, 785, 790, 792

(56) References Cited

U.S. PATENT DOCUMENTS

| | | | |
|---|---|---|---|
| 4,237,546 A | 12/1980 | Wells | 361/788 |
| 4,498,717 A | 2/1985 | Reimer | 439/62 |
| 5,259,784 A | 11/1993 | Iwatare et al. | 361/788 |
| 5,536,176 A | 7/1996 | Borchew et al. | 361/788 |
| 5,692,043 A | 11/1997 | Gliga et al. | 439/62 |
| 5,740,020 A | 4/1998 | Palatov | 361/788 |
| 5,808,867 A | 9/1998 | Wang | 361/695 |
| 6,004,139 A | 12/1999 | Dramstad et al. | 439/61 |
| 6,075,704 A | 6/2000 | Amberg et al. | 361/792 |

*Primary Examiner*—Tulsidas Patel
(74) *Attorney, Agent, or Firm*—Perkins Coie LLP

(57) ABSTRACT

A method and apparatus for expanding the circuitry of a circuit board, such as a computer motherboard. The apparatus can include a riser card: removably coupled to the circuit board and having a plurality of expansion slots for receiving expansion devices. The riser card can include a connector for receiving a second riser card having further expansion slots for removably receiving additional expansion devices. Accordingly, a single riser card can be connected to a circuit board that is installed in a chassis that can accept no more than one riser card, and a pair of such riser cards can be stacked, one upon the other, on a circuit board that is installed in a chassis that can accommodate stacked riser cards.

45 Claims, 6 Drawing Sheets

RISER CARD ASSEMBLY AND METHOD FOR ITS INSTALLATION

CROSS-REFERENCE TO RELATED APPLICATION

This application is a continuation of U.S. patent application Ser. No. 09/375,157, filed Aug. 16, 1999, now issued as U.S. Pat. No. 6,261,104.

TECHNICAL FIELD

The present invention relates to riser card assemblies for electronic devices, such as computers, and methods for their installation.

BACKGROUND OF THE INVENTION

Conventional computers typically include a chassis that encloses circuit components, such as processors, memory chips, peripheral interface devices and other circuit elements. The core circuit components, such as the processor and the memory chips, are often mounted on a single printed circuit board, such as a motherboard. It is often desirable to provide the computer with expansion ports or slots for attaching additional printed circuit cards ("expansion cards") having additional circuit elements. In this manner, a user or manufacturer can add additional capabilities and/or functions to the computer without significantly altering the existing computer structure. In one conventional arrangement, the expansion slots are provided on the motherboard. One drawback with this approach is that the expansion slots take up valuable space on the motherboard. One approach to addressing this drawback is to attach an intermediate riser card to a single slot of the motherboard and attach a plurality of expansion cards to the riser card. Accordingly, a plurality of expansion cards can be coupled to the motherboard via the riser card in an arrangement that occupies only a single slot on the motherboard.

Conventional computer chassis and motherboards come in a variety of shapes and sizes. For example, some "full-form" conventional desktop computer chassis and tower chassis are dimensioned such that a single riser card, attached to the motherboard, can have six or seven expansion slots to accommodate expansion cards. A new type of "low-profile" chassis takes up less space than the conventional full-form chassis, but the low-profile has a limited height that cannot accommodate a riser card having six or more expansion slots. For example, in one low-profile configuration with an NLX motherboard that slides into the chassis, a riser card is attached directly to a low-profile chassis and the motherboard is coupled to one slot of the riser card. The low-profile riser card can include up to three additional expansion slots that each accommodate one expansion card. One drawback with this arrangement is that a different riser card may be required for low-profile and fill-form chassis, and still a different riser card may be required for ATX or NLX motherboards. Accordingly, computer manufacturers and suppliers may be required to provide and maintain an inventory of several types of riser cards, which can be expensive and inefficient.

SUMMARY OF THE INVENTION

The present invention is directed to riser cards for expanding the circuitry of a device such as a computer. In one aspect of the invention, the riser card can include a generally flat support member having a first connector for coupling to a circuit board (such as a motherboard) of a computer, a second connector for coupling to another riser card, a plurality of expansion ports for coupling to expansion devices, and coupling circuitry coupled to the first connector and the expansion ports. In a further aspect of the invention, like riser cards can be stacked one upon the other to increase the number of expansion ports coupled to the circuit board. Alternatively, the stacked riser cards can be different. For example, the lower riser card can include a connector for coupling to the circuit board and can include pass-through circuitry for coupling to the upper riser card. The upper riser card can include a connector for connecting to the lower riser card and need not include pass-through circuitry.

The riser card connectors can include one or more of several different types. For example, where the circuit board is a motherboard, the riser card can include a connector that is removably received by a corresponding connector of a motherboard. In one embodiment, the motherboard can be attached to a computer chassis and the riser card can be removably coupled to the motherboard. In another embodiment, the riser card can be attached to the chassis and the motherboard can be removably coupled to the riser card. The connectors can include edge connectors that face toward or perpendicular to the motherboard or alternatively, the connectors can be coupled to a ribbon cable extending between the riser cards.

The present invention is also directed to methods for expanding the circuitry of a circuit board by coupling one or more riser cards to the circuit board. In one aspect of the invention, the method can include removably coupling a first riser card to a connector of the circuit board, removably coupling a second riser card to the first riser card, and removably connecting at least one selected circuit device to one of the first and second riser cards. The method can further include passing electrical signals directly from the second riser card to the circuit board via the first riser card.

In another aspect of the invention, the same type of riser card can be used for several different types of computers. For example, the method can include coupling a first riser card to a site of a first circuit board of a first type of computer where the site is configured to accommodate at most a single riser card. The method can further include coupling a second riser card of the same type as the first riser card to a site of a second circuit board of a second type of computer. The method can still further include coupling, to the second riser card a third riser card such that each of thee riser cards has an expansion port accessible for connecting to a selected device.

DETAILED DESCRIPTION OF THE INVENTION

The present invention is directed toward methods and apparatuses for expanding the circuitry of electronic devices, such as computers. The apparatus can include a modular riser card that can be installed singly in a low-profile computer chassis, or can be stacked on another riser card in a tower chassis or a larger desktop computer chassis. Many specific details of certain embodiments of the invention are set forth in the following description and in FIGS. 1–6 to provide a thorough understanding of such embodiments. One skilled in the art, however, will understand that the present invention may have additional embodiments and that they may be practiced without several of the details described in the following description.

Figure 1:
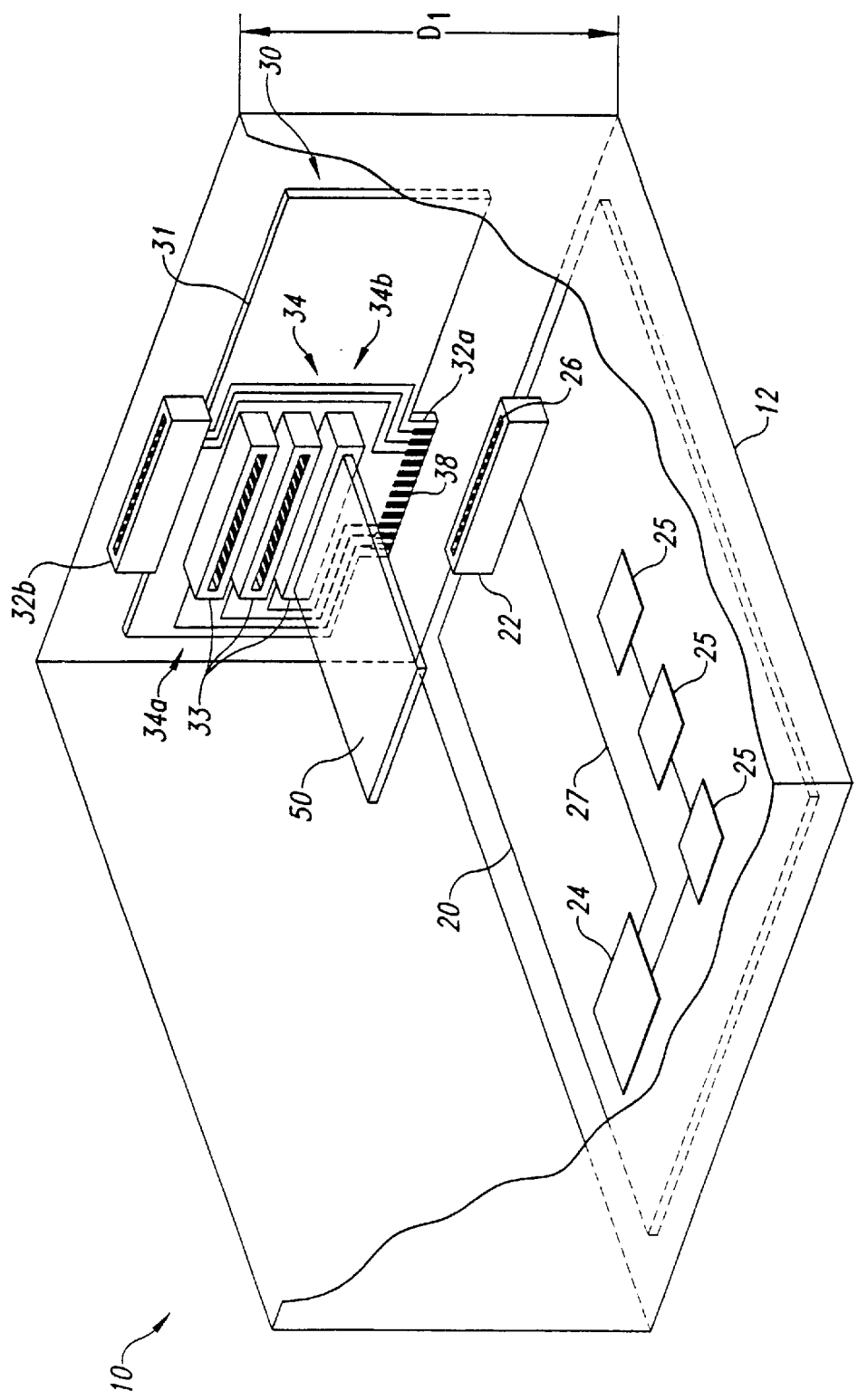
FIG. 1 is a partially schematic, cutaway top isometric view of a computer chassis having a motherboard and a riser card in accordance with an embodiment of the invention.

FIG. 1 is a top isometric view of a portion of a computer 10 having a chassis 12 that houses a motherboard 20 in accordance with an embodiment of the invention. The chassis 12 can also house other components which are not shown in FIG. 1 for purposes of clarity. The motherboard 20 can include circuit elements, such as a processor 24, memory devices 25 and connecting circuitry 27 (shown schematically in FIG. 1). The motherboard 20 can also include a motherboard connector 22 having a plurality of electrical contacts for coupling other devices to the motherboard 20. For example, in one embodiment the motherboard connector 22 can be an edge connector having a socket or slot 26 with a plurality of electrical contacts that engage corresponding electrical contacts of a riser card 30 when the riser card 30 is inserted into the slot 26. In other embodiments, the motherboard connector 22 can have other configurations.

The riser card 30 can include a support member 31 and two riser connectors 32 (shown as a lower riser connector 32a and an upper riser connector 32b) attached to the support member 31. In one embodiment, the support member 31 can include a printed circuit board, and in other embodiments, the support member 31 can include other generally rigid structures configured to support other devices, as will be discussed in greater detail below.

The lower riser connector 32a can be removably coupled to the motherboard connector 22. For example, where the motherboard connector 22 includes a slot 26, the lower riser connector 32a can be an edge connector having a tab that is removably received in the slot 26. The lower riser connector 32a can further include electrical contacts 38 that are removably coupled to corresponding electrical contacts of the motherboard connector 22 when the lower riser connector 32a is received in the slot 26. The upper riser connector 32b can include a slot generally similar to the slot 26 of the motherboard connector 22 to receive the lower riser connector 32a of another riser card, as will be discussed in greater detail below with reference to FIG. 2.

The riser card 30 shown in FIG. 1 can also include a plurality of expansion ports 33 electrically coupled to the lower riser connector 32a. In one embodiment, the expansion ports 33 can include slotted connectors, and in other embodiments the expansion ports 33 can include other types of electrical connectors. In any case, the riser card 30 can include three expansion ports 33 (as shown in FIG. 1), or the riser card 30 can include more or fewer expansion ports 33. For example, where the riser card 30 includes more than four expansion ports 33, the riser card 30 can include one or more bridge chips, such as are commercially available, to support the additional expansion ports 33. The expansion ports 33 can be positioned in one or both of the oppositely facing planar surfaces of the support member 31.

Each expansion port 33 can be configured to removably receive an expansion device 50. In one embodiment, the expansion device 50 can include a printed circuit board having circuit elements that are coupled to the motherboard 20 via the riser card 30. For example, the expansion device 50 can include a video card, a modem card, a network card or another type of card. Alternatively, the expansion devise 50 can include any device that is compatible with the motherboard 20.

The riser card 30 can also include coupling circuitry 34 (shown schematically in FIG. 1). The coupling circuitry 34 can include connecting leads 34a that connect the expansion ports 33 to the lower riser connector 32a. The coupling circuitry 34 can also include pass-through circuitry 34b that extends between the lower riser connector 32a and the upper riser connector 32b. As will be discussed in greater detail below with reference to FIG. 2, the pass-through circuitry 34b is generally not coupled to the expansion ports 33, but rather transmits electrical signals directly between the two riser connectors 32.

Figure 2:
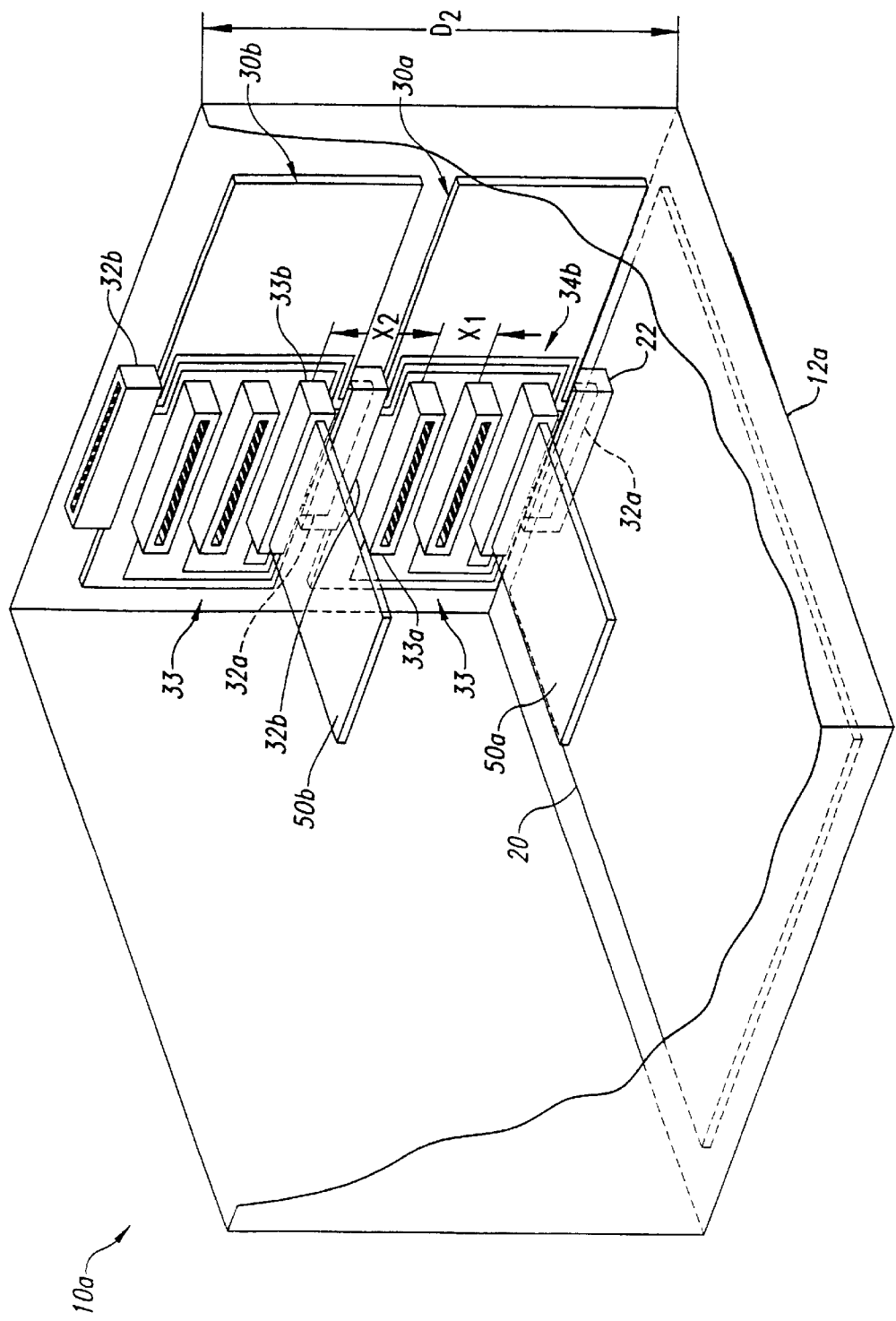
FIG. 2 is a cutaway top isometric view of a computer chassis having a motherboard and a pair of riser cards in accordance with another embodiment of the invention.

The computer chassis 12 shown in FIG. 1 is a low-profile chassis having a depth $D_1$ that can accommodate a single riser card 30. Accordingly, up to three expansion devices 50 can be electrically coupled to the motherboard 20 via the single riser card 30. FIG. 2 is a top isometric view of a full-form computer 10a having a chassis 12a with a depth $D_2$ that can accommodate a plurality of riser cards 30. For example, the chassis 12a can accommodate two stacked riser cards 30, shown as a lower riser card 30a coupled to the motherboard 20 and an upper riser card 30b coupled to the lower riser card 30a. The lower riser card 30a can be connected to the motherboard 20 in a manner similar to that discussed above with reference to FIG. 1.

In one embodiment, the upper riser card 30b can be configured identically to the lower riser card 30a. Accordingly, the upper riser card 30b can include a lower riser connector 32a that is removably attached to the upper riser connector 32b of the lower riser card 30a. In this manner, the upper riser card 30b can be both physically and electrically coupled to the lower riser card 30a in a stacked configuration. As a result, the combination of riser cards 30 can provide six expansion ports 33 to accommodate up to six expansion devices 50, two of which are shown in FIG. 2 as a lower expansion device 50a and an upper expansion device 50b. In another embodiment, where the depth $D_2$ of the chassis 12a is greater than that shown in FIG. 2, additional riser cards 30 can be coupled to the upper riser card 30b to provide for an even greater number of expansion ports 33.

In one embodiment, the upper expansion devices 50b are electrically coupled to the motherboard 20 via the pass-through circuitry 34b on the lower riser card 30a. As discussed above with reference to FIG. 1, the pass-through circuitry 34b can connect the upper and lower riser connectors 32 of the lower riser card 30a without connecting directly to the expansion ports 33 of the lower riser card 30a. Accordingly, the pass-through circuitry 34b can provide a direct link between the motherboard 20 and the upper expansion devices 50b without directly coupling the upper expansion devices 50b to the lower expansion devices 50a. In one aspect of this embodiment, all the expansion devices 50 may still communicate with each other indirectly, via the motherboard 20.

The expansion ports 33 on each of the riser cards 30 are separated by a distance $X_1$, and the uppermost expansion port 33a of the lower riser card 30a is separated from the lowermost expansion port 33*b* of the upper riser card 30*b* by a distance X₂. In one embodiment, the distances X₁ and X₂ are approximately equal so that adjacent expansion ports 33 are separated by approximately the same distance, regardless of which riser card they are attached to. For example, the expansion ports 33 can be spaced apart by approximately 0.8 inches. An advantage of this arrangement is that it may be possible to more efficiently fill a given vertical distance with expansion ports. In one aspect of this embodiment the expansion ports 33 can be offset laterally from an axis extending between lower riser connector 32*a* and the upper riser connector 32*b*, as shown and discussed in greater detail below with reference to FIG. 4. A further advantage of laterally offsetting the expansion ports 33 is that it may be easier to separate all the expansion ports 33*b* the same distance where the vertical positions of the expansion ports 33 are not constrained by the positions of the riser connectors 32.

In an alternate arrangement, the distance X₁ can be different than the distance X₂. For example, the distance X₂ can be greater than X₁. An advantage of this arrangement is that expansion devices 50 requiring additional vertical space can be accommodated in expansion ports separated by the distance X₂ and expansion devices 50 requiring less vertical space can be accommodated in expansion ports separated by the distance X₁.

In another embodiment, the distances X₁ and X₂ between the expansion devices 50, as well as the distance between the riser cards 30 and other components on the motherboard 20 can be selected so as not to exceed the critical path length between components. For example, it may be important in some cases to position an expansion device 50, such as a video card, a selected distance (as measured along an electrical path) from other devices, such as the processor 24 (FIG. 1). This can be accomplished by positioning the motherboard connector 22 a selected distance from the processor 24 and/or by selecting the distances X₁ and X₂ (or the particular expansion port 33 to which the expansion device 50 is connected) to place the expansion device 50 at the desired location.

In one embodiment, the riser cards 30 can include a termination circuit, for example, an RC circuit mounted to a printed circuit board that connects to the upper riser connector 32*b* of the upper riser card 30*b* (or the upper riser connector 32*b* of the lower riser card 30*a* where the upper riser card 30*b* is not present; see FIG. 1). The purpose of the termination circuit is to prevent signal reflections at the unconnected upper riser connector 32*b*.

One feature of the riser cards 30 shown in FIGS. 1 and 2 is that a single type of riser card 30 can be installed in a variety of types of computer chassis. For example, one riser card 30 of the type discussed above can be positioned in a low-profile or other relatively small chassis, such as the chassis 12 shown in FIG. 1, to provide the computer 10 with a selected number of expansion ports 33. A plurality of the same type of riser cards 30 can be positioned in a full-form or other larger chassis, such as the chassis 12*a* shown in FIG. 2, to provide an increased number of expansion ports. Accordingly, the same type of riser card can be installed in a number of different types of chassis to provide each type of chassis with a selected number of expansion ports 33. An advantage of this feature is that manufacturers need only produce a single type of riser card 30, and distributors need only inventory a single type of riser card 30 to be compatible with several types of computer chassis.

Figure 3:
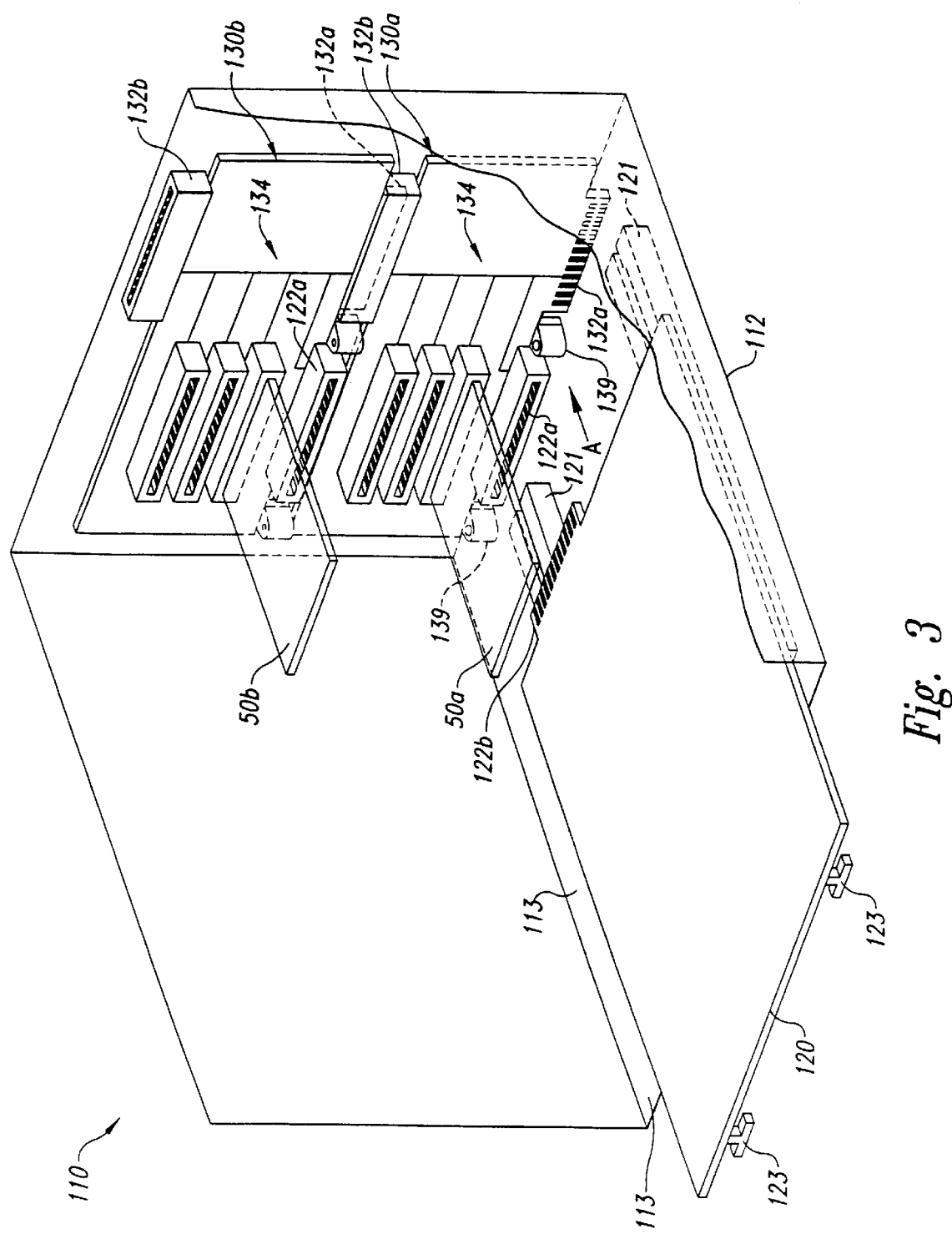
FIG. 3 is a cutaway top isometric view of a computer chassis having a motherboard and a pair of riser cards in accordance with yet another embodiment of the invention.

FIG. 3 is a partially schematic, top isometric view of a computer 110 that includes a computer chassis 112, a motherboard 120, and riser cards 130 (shown as a lower riser card 130*a* and an upper riser card 130*b*) in accordance with another embodiment of the invention. In one aspect of this embodiment, the lower riser card 130*a* is attached directly to a lower surface 113 of the chassis 112, and the motherboard 120 is slidably attached to the lower riser card 130*a* and the lower surface 113. For example, the lower riser card 130*a* can include two bosses 139 that are bolted to the chassis 112. Alternatively, the lower riser card 130*a* can be attached to the chassis 112 with other types of fasteners. In any case, the lower riser card 130*a* can include a first motherboard connector 122*a* (for example, a socket) configured to couple to a second motherboard connector 122*b* (for example, a tab) on the motherboard 120.

The second motherboard connector 122*b* is slidably and removably received by the first motherboard connector 122*a* of the lower riser card 130*a* as the motherboard 120 is moved toward the lower riser card 130*a* (indicated by arrow "A"). Accordingly, the motherboard 120 can be selectively engaged or disengaged with the lower riser card 130*a* by moving the motherboard 120 in a direction generally perpendicular to the plane of the first riser card 130*a*. An advantage of this arrangement is that the motherboard 120 can be removed from the chassis 112 without removing the lower riser card 130*a*.

The motherboard 120 can include guide members 123 that slidably and removably engage corresponding slotted guide rails 121 positioned on the lower surface 113 of the chassis 112. The guide members 123 and guide rails 121 guide the motherboard 120 as it moves toward the lower riser card 130*a*. In one embodiment, the motherboard 120 can be an NLX type motherboard, and the chassis 112 can be an NLX type chassis, both in accordance with NLX specifications from Intel Corporation of Santa Clara, Calif. Alternatively, the motherboard 120 and the chassis 112 can have other configurations that allow the motherboard to be removably attached to the chassis 112.

The lower riser card 130*a* can further include a lower riser connector 132*a* that remains unconnected when the lower riser card 130*a* is attached directly to the chassis 112. In one aspect of this embodiment, the lower riser connector 132*a* can be configured to couple with a motherboard connector 22 of the type shown in FIG. 1. Accordingly, the same lower riser card 130*a* can be connected to a motherboard 20 of the type shown in FIG. 1, or to a motherboard 120 of the type shown in FIG. 3, further increasing the modularity of the riser cards 130.

The lower riser card 130*a* can include an upper riser connector 132*b* configured to receive a corresponding lower riser connector 132*a* of the upper riser card 130*b* when the two riser cards are stacked (shown in FIG. 3). The first motherboard connector 122*a* and the upper riser connector 132*b* of the upper riser card 130*b* remain unconnected when the upper riser card 130*b* is coupled to the lower riser card 130*a* in a stacked configuration with only two riser cards. Accordingly, although certain features of each riser card 130 may not be utilized (depending upon whether the riser card 130 is attached directly to the chassis 112 or attached to another riser card 130), the upper and lower riser cards 130*a* and 130*b* can be identical, eliminating the need to manufacture and inventory a store of separate riser cards for different computer chassis.

In one embodiment, each riser card 130 can include a bus 134, shown schematically in FIG. 3. The bus 134 can be coupled to the upper and lower connectors 132*a*, 132*b* of each riser card 130, and can also be coupled to the first motherboard connector 122a and expansion ports 133 of each riser card 130. Accordingly, expansion devices 50a and 50b coupled to either riser card 130 can communicate via the bus 134 with any other expansion device 50, regardless of whether the other expansion devices 50 are coupled to the lower riser card 130a or the upper riser card 130b.

Figure 4:
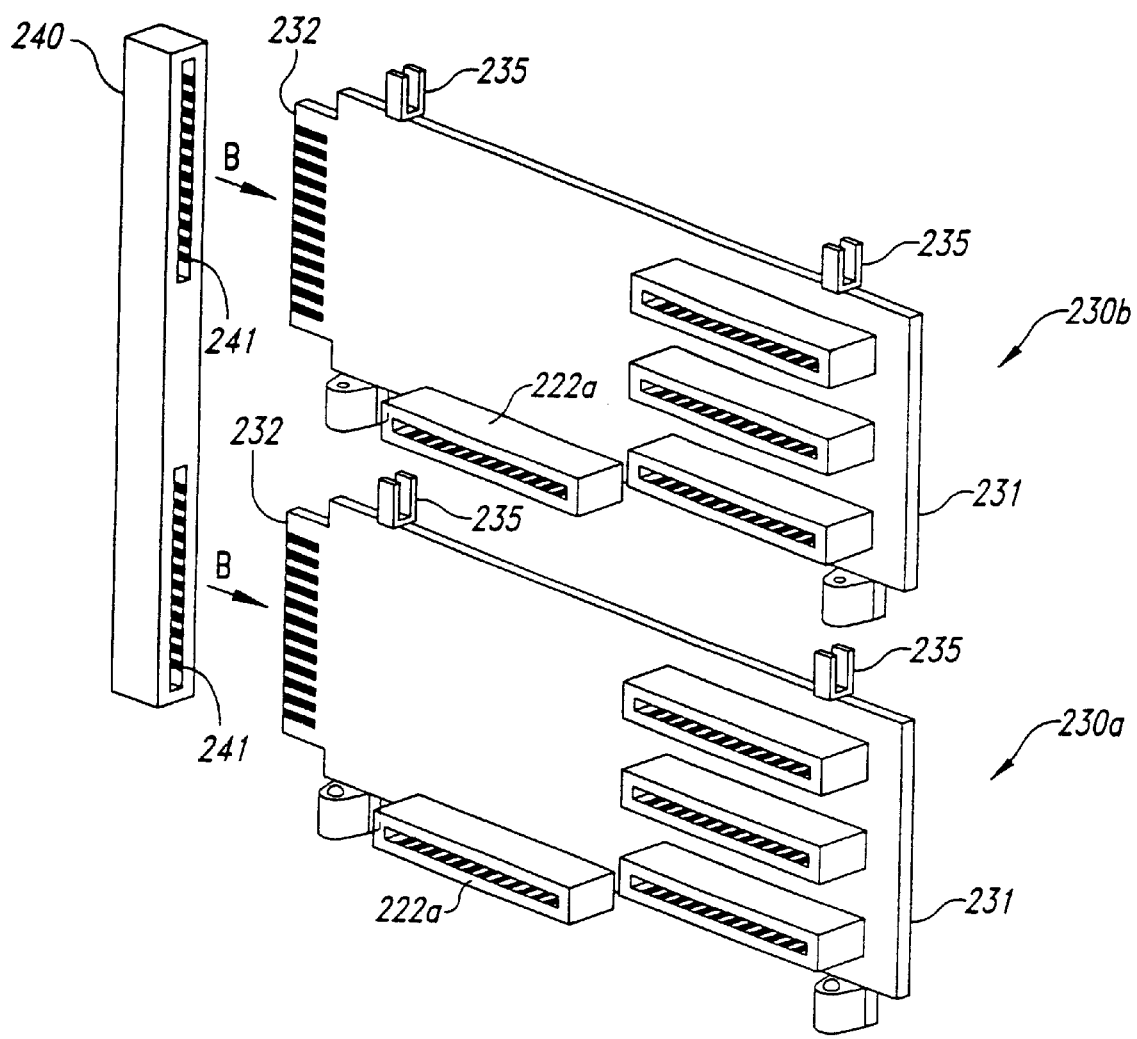
FIG. 4 is a side isometric view of a pair of riser cards coupled with an edge connector in accordance with an embodiment of the invention.

FIG. 4 is a side isometric view of two riser cards 230 (shown as a lower riser card 230a and an upper riser card 230b) coupled at the sides of the riser cards with a riser coupler 240 in accordance with another embodiment of the invention. In one embodiment, each riser card 230 can include a support member 231 having a side-mounted riser connector 232 projecting from an edge of the riser card that is generally perpendicular to the motherboard 120 (FIG. 3). In one aspect of this embodiment, the riser connector 232 can include a tab with electrical contacts. The riser coupler 240 can have two slots 241, each having corresponding electrical contacts configured to engage the electrical contacts of one of the riser connectors 232 when the riser coupler 240 is moved toward the connectors 232 (shown by arrows "B"). Accordingly, the riser coupler 240 can provide both a physical and an electrical connection between the two riser cards 230. Alternatively, the riser coupler 240 and the riser connectors 232 can have other configurations that physically and electrically couple the riser cards 230.

In one embodiment, the riser coupler 240 alone can adequately support the upper riser card 230b in position above the lower riser card 230a. In another embodiment, the riser cards 230 can be configured to provide additional support to the upper riser card 230b. For example, the lower riser card 230a can include clips 235 that hold the support member 231 of the upper riser card 230b. Alternatively the clips 235 can engage the first motherboard connector 222a of the upper riser card 230b, or the riser cards 230 can be coupled with other releasable fasteners. In the embodiment shown in FIG. 4, both the lower riser card 230a and the upper riser card 230b can include clips 235 to provide for increased commonality, even though only the clips 235 of the lower riser card 230a may be utilized. Alternatively, the clips 235 of the upper riser card 230b can be eliminated.

Another feature of the riser cards 230 shown in FIG. 4 is that they can include adjacent expansion ports 233 that are equally spaced, regardless of which riser card they are attached to. The expansion ports 233 can be laterally offset from the first motherboard connectors 222a so that the vertical position of the expansion ports is not constrained by the position of the motherboard connector 222a. As was discussed above with reference to FIG. 2, the expansion ports can also be offset where the riser card includes aligned riser connectors, such as the lower riser connector 32a and the upper riser connector 32b shown in FIG. 2.

Figure 5:
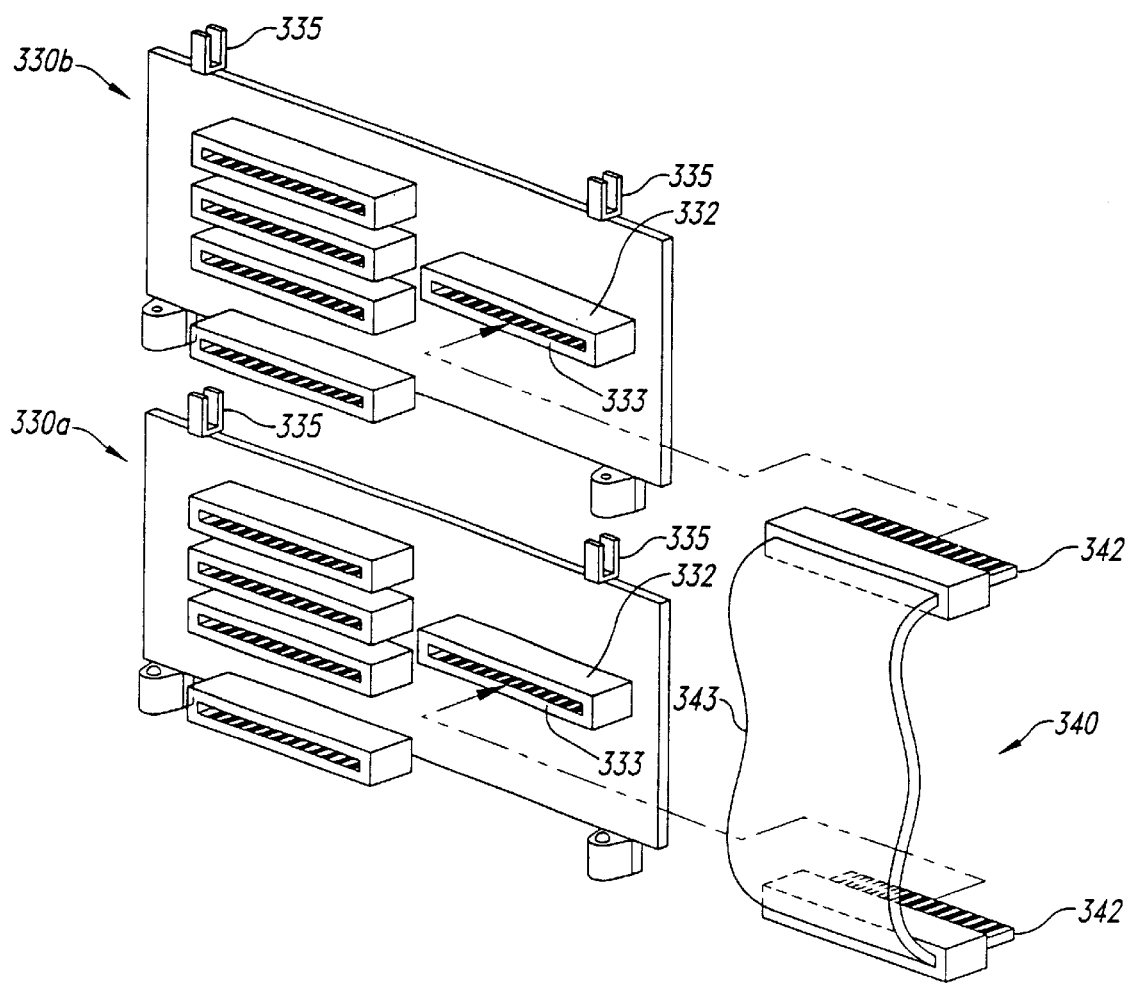
FIG. 5 is a side isometric view of a pair of riser cards coupled with a ribbon cable in accordance with another embodiment of the invention.

FIG. 5 is a side isometric view of two riser cards 330 (shown as a lower riser card 330a and an upper riser card 330b) coupled with a ribbon coupler 340 in accordance with another embodiment of the invention. In one aspect of this embodiment, the ribbon coupler 340 can include a ribbon cable 343 having a ribbon connector 342 at each end. Each riser card 330 can include a riser connector 332 having a slot 333 configured to removably receive one of the connectors 342 of the ribbon coupler 340. As discussed above with reference to FIG. 5, each riser card 330 can include one or more clips 335 configured to hold an upper riser card. As was also discussed above with reference to FIG. 5, the riser cards 330 can include other fasteners to support the upper riser card 330b relative to the lower riser card 330a.

Figure 6:
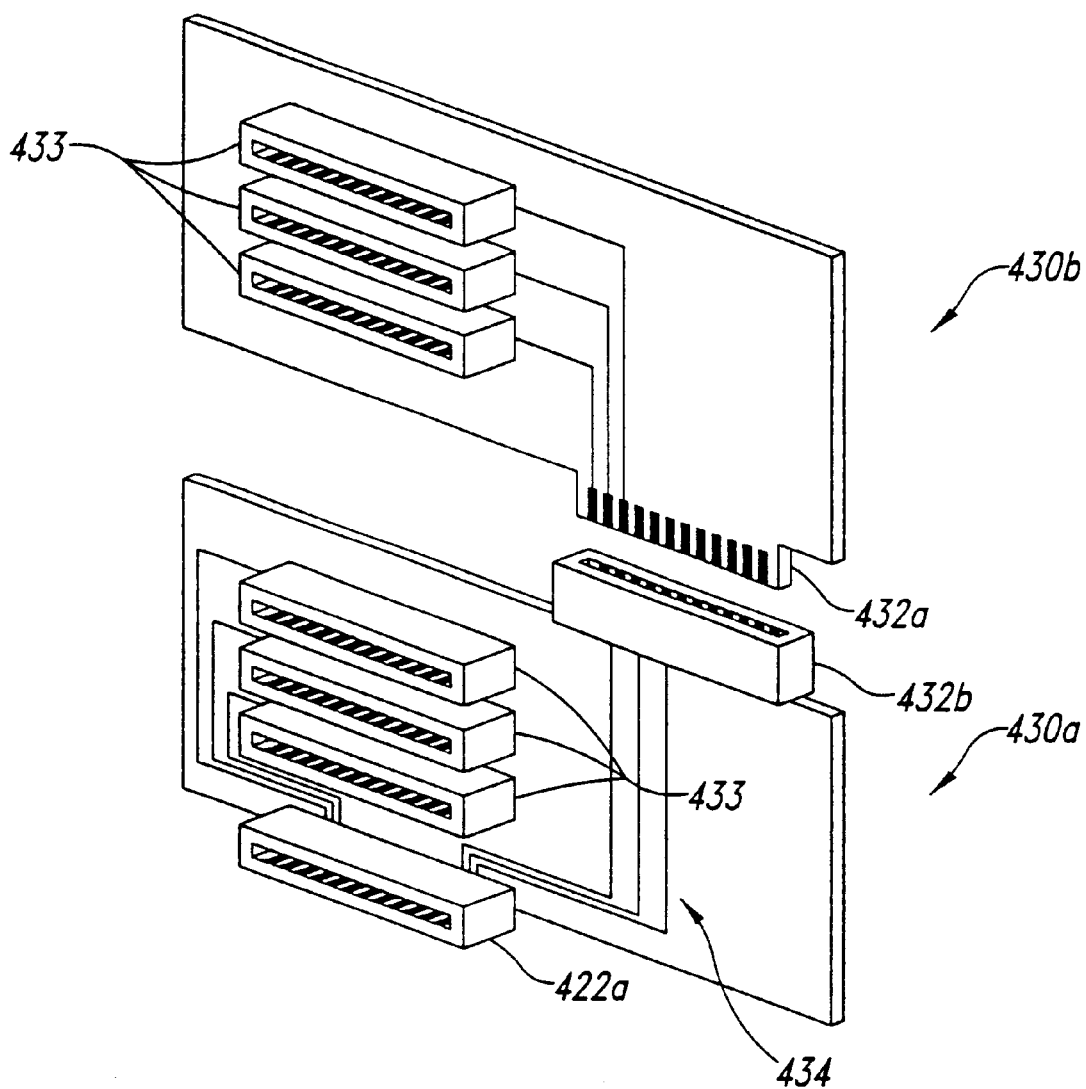
FIG. 6 is a side isometric view of pair of riser cards, each having a different configuration in accordance with still another embodiment of the invention.

FIG. 6 is a side isometric view of two riser cards 430 (shown as a lower riser card 430a and an upper riser card 430b) that have different configurations in accordance with still another embodiment of the invention. For example, the lower riser card 430a can include a first motherboard connector 422a for coupling to the second motherboard connector 122b shown in FIG. 3. The lower riser card 430a can also include an upper riser connector 432b coupled with pass-through circuitry 434 to the first motherboard connector 422a. The upper riser card 430b can include a lower riser connector 432a which, in one embodiment, can include a tab portion that is removably received by a corresponding slot of the upper riser connector 432a of the lower riser card 430a. In one aspect of the embodiment shown in: FIG. 6, the lower riser connector 432a of the upper riser card 430b can face downward and the upper riser connector 432b of the lower riser card 430a can face upward. Accordingly, the upper and lower riser cards 430 can be joined by moving the riser cards 430 toward each other in the plane of the riser cards 430. In an alternate arrangement (not shown), the riser connectors 432 can face generally horizontally and can be connected by moving the riser cards together in a direction generally perpendicular to the plane of the riser cards. In other embodiments, the riser cards 430 can be connected by moving them together in other directions. In any case, each riser card 430 can include a plurality of expansion ports 433 to accommodate one or more of the expansion devices 50 (FIG. 1).

One feature of the arrangement shown in FIG. 6 is that the riser cards 430a and 430b include features that correspond to the position of the riser card with respect to the motherboard. For example, the lower riser card 430a includes a first motherboard connector 422a and an upper riser connector 432b, but does not include a lower riser connector 432a. Furthermore, the upper riser card 430b includes a lower riser connector 432a for coupling to the lower riser card 430a, but does not include a first motherboard connector 422a, an upper riser connector 432b, or pass-through circuitry 434 because these features are not required for a riser card in the upper position. An advantage of this arrangement is that the riser cards need not include features or elements that will not be used once the riser card is placed in a selected position. Conversely, an advantage of the riser cards discussed above with reference to FIGS. 1–5 is that the upper and tower riser cards can be interchangeable.

From the foregoing it will be appreciated that, although specific embodiments of the invention have been described herein for purposes of illustration, various modifications may be made without deviating from the spirit and scope of the invention. For example, the riser cards were described above in the context of computer chassis, for purposes of illustration. The same or similar riser cards can also be installed in other electronic devices, such as instrumentation equipment, telecommunication equipment or other devices where modular riser cards are suitable. Furthermore, the features of individual embodiments of the riser cards shown in the figures need not be limited to these embodiments. For example, any of the riser cards can include a bus or pass-through circuitry. Accordingly, the invention is not limited except as by the appended claims.

What is claimed is:

1. An assembly for supporting computer components, comprising:
   a motherboard having a motherboard connector and at least one of a processor device and a memory device; and
   a riser card primarily supported by the motherboard, the riser card including:

a support member;

a first connector on the support member and having a plurality of electrical contacts for coupling to the motherboard connector;

a second connector on the support member and having a plurality of electrical contacts for coupling to another riser card when the other riser card is spaced apart from the motherboard;

a plurality of expansion ports on the support member, each expansion port having a plurality of electrical contacts for removable coupling to a selected device, the expansion ports being electrically coupled to at least one of the first and second connectors; and coupling circuitry on the support member and electrically coupled to at least the first connector and the expansion ports.

2. The assembly of claim 1 wherein the support member defines a generally flat support member plane and the first connector includes a first socket having a slot oriented generally perpendicular to the support member plane for slideably receiving a corresponding tab of the motherboard, further wherein the second connector includes a second socket having a slot oriented generally parallel to the support member plane for slideably receiving a tab of the other riser card.

3. The assembly of claim 1 wherein the support member can be attached above or below the other riser card, the support member defines a generally flat support member plane and the first connector includes a first socket having a slot oriented generally perpendicular to the support member plane for slideably receiving a corresponding tab of the motherboard, the second connector includes a second socket having a slot oriented generally parallel to the support member plane for receiving a tab of the other riser card when the other riser card is positioned above the support member, each expansion port includes a socket having a slot oriented generally perpendicular to the support member plane for receiving a corresponding tab of a selected device, further wherein the coupling circuitry includes a first electrical link between the first connector and the expansion ports and a second electrical link between the first connector and the second connector, and wherein the riser card further comprises a third connector on the support member that includes a tab configured to couple to the other riser card when the other riser card is positioned beneath the support member.

4. The assembly of claim 1 wherein the first connector includes a tab configured to be removably received by a corresponding socket of the motherboard, the second connector includes a socket configured to removably receive a tab of the other riser card, the expansion ports each include a socket configured to receive a corresponding tab of a selected device, the coupling circuitry includes a first portion coupling the first connector to the expansion ports and a second portion coupling the first connector to the second connector.

5. The assembly of claim 1 wherein the first connector includes a socket configured to removably receive a corresponding tab of the motherboard, the second connector includes a socket for receiving a tab of the other riser card when the support member is positioned beneath the other riser card, and wherein the riser card further comprises a third connector that includes a tab for coupling to the other riser card when the other riser card is positioned beneath the support member.

6. The assembly of claim 1 wherein the second connector includes a ribbon cable having first and second opposite ends with a first ribbon connector at the first end releasably coupled to the support member and a second ribbon connector at the second end configured to be coupled to the other riser card.

7. The assembly of claim 1 wherein the support member has an edge generally parallel to the motherboard and the second connector includes an edge connector proximate to the edge of the support member.

8. The assembly of claim 1 wherein the support member has a first edge generally parallel to the motherboard, a second edge generally perpendicular to the motherboard and the second connector includes an edge connector proximate to the second edge of the support member.

9. The assembly of claim 1 wherein the motherboard is a first printed circuit board and the support member includes a second printed circuit board.

10. The assembly of claim 1 wherein the support member defines a support member plane and at least one of the expansion ports faces away from the support member plane to receive the selected device.

11. The assembly of claim 1 wherein the expansion ports intersect an axis extending between the first and second connectors.

12. The assembly of claim 1 wherein the expansion ports are offset from an axis extending between the first and second connectors.

13. The assembly of claim 1 wherein the coupling circuitry includes a bus coupled to the first and second connectors and coupled to the expansion ports.

14. The assembly of claim 1 wherein the coupling circuitry includes pass-through circuitry coupled to the first and second connectors and decoupled from the expansion ports.

15. An assembly of printed circuit boards for a computer, comprising:

a motherboard having at least one of a processor and a memory device, the motherboard further having a motherboard connector;

a first riser card releasably coupled to the motherboard, the first riser card having a first support member, first and second connectors on the first support member, the first connector being removably coupled to the motherboard connector, a first plurality of expansion ports attached to the first support member, and coupling circuitry on the first support member at least a portion of which is electrically coupled to the first connector and the first plurality of expansion ports; and a second riser card releasably coupled to and primarily supported by the first riser card and spaced apart from the motherboard, the second riser card having a second support member, a third connector electrically coupled to the second connector of the first riser card, a fourth connector configured to receive a corresponding connector of another riser card, and a second plurality of expansion ports attached to the second support member and electrically coupled to the third connector, the second plurality of expansion ports being further operatively coupled to the motherboard through the first riser card.

16. The assembly of claim 15 wherein the coupling circuitry of the first riser card includes a bus coupled to the first connector, the second connector and the first plurality of expansion ports of the first riser card.

17. The assembly of claim 15 wherein the coupling circuitry includes pass-through circuitry coupled to the first and second connectors of the first riser card and decoupled from the expansion ports of the first riser card.

18. The assembly of claim 15 wherein the second riser card includes pass-through circuitry connected between the third and fourth connectors of the second riser card for transmitting signals directly between the third and fourth connectors.

19. The assembly of claim 15 wherein the first connector includes a first slotted socket for receiving a tab of the motherboard connector, the second connector includes a second slotted socket and the third connector includes a tab removably received in the second slotted socket.

20. The assembly of claim 15 wherein the first plurality of expansion ports and the first and second connectors of the first riser card are arranged generally similarly to an arrangement of the second plurality of expansion ports and the third and fourth connectors of the second riser card.

21. The assembly of claim 15, further comprising a ribbon coupler having a ribbon cable with first and second ends, a first ribbon connector toward the first end of the ribbon cable and releasably coupled to the second connector of the first riser card and a second ribbon connector toward the second end of the ribbon cable releasably coupled to the third connector of the second riser card.

22. The assembly of claim 15 wherein the first riser card has an edge generally parallel to the motherboard and the second connector includes a socket proximate to the edge of the first riser card, the socket having a slot for receiving the motherboard connector.

23. The assembly of claim 15 wherein each riser card has a first edge generally parallel to a plane of the motherboard and a second edge generally perpendicular to the plane of the motherboard, the second and third connectors each including a tab proximate to the second edge of the support member, and wherein the assembly further comprises a riser coupler having a first slot for receiving the tab of the second connector and a second slot for receiving the tab of the third connector.

24. A computer system, comprising:
a chassis;
a motherboard removably coupled to the chassis and having a motherboard connector and at least one of a processor and a memory device;
a first riser card primarily supported by the motherboard, the first riser card having a first plurality of expansion ports each configured to be removably coupled to selected devices, a first connector removably coupled to the motherboard connector and a second connector configured to connect to another riser card; and
a second riser card primarily supported by the first riser card, the second riser card spaced apart from the motherboard and having a second plurality of expansion ports each configured to be removably coupled to selected devices, the second riser card further having at least a third connector removably coupled to the second connector of the first riser card, and circuitry to electrically couple the second expansion ports with the third connector.

25. The computer system of claim 24 wherein the second riser card has a fourth connector configured to be removably coupled to the motherboard connector of the motherboard.

26. The computer system of claim 24 wherein the first riser card includes pass-through circuitry connected between the first and second connectors and decoupled from the first plurality of expansion ports for transmitting electrical signals directly between the motherboard and the second riser card.

27. The computer system of claim 24 wherein the first riser card is generally perpendicular to the motherboard and defines a riser card plane, the second riser card being coupled to the first riser card in the riser card plane.

28. The computer system of claim 24 further comprising a ribbon coupler having a ribbon cable with first and second ends, a first ribbon connector toward the first end of the ribbon cable releasably coupled to the second connector of the first riser card and a second ribbon connector toward the second end of the ribbon cable releasably coupled to the third connector of the second riser card.

29. The computer system of claim 24 wherein the first riser card has an edge generally parallel to the motherboard and the second connector includes a socket proximate to the edge of the first riser card, the socket having a slot for receiving the motherboard connector.

30. A method for expanding the circuitry of a circuit board, comprising:
removably coupling a first riser card to a connector of the circuit board to connect the riser card with memory devices and/or processors of the circuit board, the first riser card being supported primarily by the circuit board;
removably coupling a second riser card to the first riser card with the second riser card spaced apart from the circuit board, the second riser card being supported primarily by the first riser card;
removably connecting at least one selected circuit device to one of the first and second riser cards; and
passing electrical signals from the selected circuit device to the circuit board.

31. The method of claim 30 wherein the circuit board includes a motherboard attached to a computer chassis, further wherein coupling the first riser card includes moving the first riser card toward the motherboard in a plane generally, perpendicular to a plane of the motherboard.

32. The method of claim 30 wherein coupling the second riser card to the first riser card includes inserting a tab portion of the connector of the second riser card into a socket of the connector of the first riser card.

33. The method of claim 30 wherein coupling the second riser card to the first riser card includes coupling a ribbon cable between the first and second riser cards.

34. The method of claim 30 wherein coupling the second riser card to the first riser card includes coupling a first connector adjacent an edge of the first riser card to a second connector adjacent an edge of the second riser card.

35. The method of claim 30 wherein coupling the second riser card to the first riser card includes coupling a slotted coupler to a first tab of the first riser card and a second tab of the second riser card.

36. The method of claim 30 wherein the selected circuit device is connected to the second riser card, further wherein passing electrical signals from the selected circuit device to the circuit board includes passing the signals directly to the circuit board with pass-through circuitry of the first riser card and without transmitting the signals directly to other selected circuit devices attached to the first riser card.

37. The method of claim 30 wherein passing electrical signals from the selected circuit device to the circuit board includes passing the electrical signals to a bus of the first riser card.

38. A method for coupling a single type of riser card to a plurality of types of computers, comprising:
coupling a first riser card to a site of a first circuit board of a first type of computer to connect the first riser card to a memory device and/or a processor of the first circuit board, the site being configured to accommodate at most a single riser card, the first riser card being supported primarily by the first circuit board;

coupling a second riser card of the same type as the first riser card to a site of a second circuit board of a second type of computer different than the first type of computer to connect the second riser card to a memory device and/or a processor of the second circuit board, the second riser card being supported primarily by the second circuit board; and coupling to the second riser card a third riser card spaced apart from the second circuit board such that each of the riser cards has an expansion port accessible for connecting to a selected device, the third riser card being supported primarily by the second riser card.

39. The method of claim 38, further comprising positioning the first circuit board in a chassis having a dimension in a direction generally perpendicular to the first circuit board that is less than twice a dimension of the first riser card in the same direction.

40. The method of claim 38 wherein coupling a third riser card includes moving the third riser card in a direction generally in a plane of the second riser card.

41. The method of claim 38 wherein coupling a third riser card includes coupling a third riser card of the same type as the first riser card.

42. The method of claim 38, further comprising passing electrical signals directly between the third riser card and the circuit board of the second type of computer via the second riser card.

43. The method of claim 38 wherein coupling the third riser card to the second riser card includes inserting a tab portion of the third riser card into a socket of the second riser card.

44. The method of claim 38 wherein coupling the third riser card to the second riser card includes coupling a ribbon cable between the third and second riser cards.

45. The method of claim 38 wherein coupling the third riser card to the second riser card includes coupling a slotted coupler to a first tab of the second riser card and a second tab of the third riser card.

* * * * *

UNITED STATES PATENT AND TRADEMARK OFFICE
CERTIFICATE OF CORRECTION

PATENT NO.   : 6,491,526 B2 Page 1 of 1
DATED        : December 10, 2002
INVENTOR(S)  : Leman It is certified that error appears in the above-identified patent and that said Letters Patent is hereby corrected as shown below:

<u>Title page,</u>
Item [57], ABSTRACT,
Line 3, delete colon between "card" and "removably";

<u>Column 2,</u>
Line 44, delete comma between "coupling" and "to";
Line 45, "thee" should be -- the --;

<u>Column 5,</u>
Line 15, "33$b$" should be -- 33 by --;

<u>Column 7,</u>
Line 33, insert comma between "alternatively" and "the";

<u>Column 8,</u>
Line 14, delete colon between "in" and "FIG.";
Line 43, "tower" should be -- lower --;

<u>Column 12,</u>
Line 1, insert comma between "24" and "further";
Line 33, delete comma between "generally" and "perpendicular";

Signed and Sealed this

Twenty-fourth Day of June, 2003

JAMES E. ROGAN
*Director of the United States Patent and Trademark Office*